(12) United States Patent
Kimura

(10) Patent No.: US 10,138,549 B2
(45) Date of Patent: Nov. 27, 2018

(54) SCANNING OPTICAL APPARATUS AND METHOD FOR MANUFACTURING REFLECTION MEMBER

(71) Applicant: CANON KABUSHIKI KAISHA, Tokyo (JP)

(72) Inventor: Kazumi Kimura, Toda (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 69 days.

(21) Appl. No.: 14/722,678

(22) Filed: May 27, 2015

(65) Prior Publication Data

US 2015/0259789 A1    Sep. 17, 2015

Related U.S. Application Data

(62) Division of application No. 14/096,621, filed on Dec. 4, 2013.

(30) Foreign Application Priority Data

Dec. 11, 2012 (JP) .................................. 2012-270305

(51) Int. Cl.
*G02B 26/10* (2006.01)
*C23C 14/58* (2006.01)
(Continued)

(52) U.S. Cl.
CPC .......... *C23C 14/5886* (2013.01); *C23C 14/18* (2013.01); *G02B 26/10* (2013.01); *G03G 15/0435* (2013.01); *Y10T 29/49885* (2015.01)

(58) Field of Classification Search
CPC ... C23C 14/5886; C23C 14/18; G02B 5/0883; G02B 26/10; G02B 5/0891; G02B 5/0808
See application file for complete search history.

(56) References Cited

U.S. PATENT DOCUMENTS 6,317,244 B1 * 11/2001 Ishibe .................. G02B 26/127
347/235
6,411,325 B1   6/2002 Matsushita et al.
(Continued)

FOREIGN PATENT DOCUMENTS

JP         S5872105 A      4/1983
JP         H01-113216 U    7/1989
(Continued)

OTHER PUBLICATIONS

Office Action for corresponding Japanese Application No. 2012-270305 dated Aug. 30, 2016.

*Primary Examiner* — Francisco W Tschen
(74) *Attorney, Agent, or Firm* — Carter, DeLuca, Farrell & Schmidt, LLP

(57) ABSTRACT

A scanning optical apparatus includes: a deflection unit configured to deflect a light flux from a light source in a main scanning direction; an incident optical system configured to introduce the light flux from the light source to the deflection unit; a condensing optical system configured to condense the light flux from the deflection unit onto a scanned surface; and a reflection member arranged in a light path of the light flux deflected in the main scanning direction by the deflection unit and configured to reflect a part of the deflected light flux. The reflection member has a reflection surface configured to reflect the deflected light flux, a first end surface formed in the main scanning direction, and a second end surface formed in a sub-scanning direction perpendicular to the main scanning direction, and the second end surface has a higher degree of corrosion resistance than the first end surface.

15 Claims, 5 Drawing Sheets

(51) Int. Cl.
*G03G 15/043* (2006.01)
*C23C 14/18* (2006.01)

(56) References Cited

U.S. PATENT DOCUMENTS

| | | | | |
|---|---|---|---|---|
| 2001/0019444 | A1* | 9/2001 | Takada | G02B 26/125 |
| | | | | 359/207.1 |
| 2001/0024087 | A1* | 9/2001 | Suehiro | H01L 33/60 |
| | | | | 313/512 |
| 2002/0045073 | A1* | 4/2002 | Finley | C03C 17/3417 |
| | | | | 428/701 |
| 2002/0108260 | A1* | 8/2002 | Gartner | B28D 1/30 |
| | | | | 33/18.1 |
| 2002/0176988 | A1* | 11/2002 | Medwick | B65G 49/069 |
| | | | | 428/408 |
| 2010/0242953 | A1* | 9/2010 | Bhandari | C03B 23/0357 |
| | | | | 126/684 |
| 2011/0226234 | A1* | 9/2011 | Dros | C03C 17/3663 |
| | | | | 126/684 |

FOREIGN PATENT DOCUMENTS

| | | |
|---|---|---|
| JP | H08-179230 A | 7/1996 |
| JP | 2002-046299 A | 2/2002 |
| JP | 2002-267822 A | 9/2002 |
| JP | 2004-361717 A | 12/2004 |
| JP | 2012-022169 A | 2/2012 |

* cited by examiner

SCANNING OPTICAL APPARATUS AND METHOD FOR MANUFACTURING REFLECTION MEMBER

BACKGROUND OF THE INVENTION

Field of the Invention

The present invention relates to a scanning optical apparatus and a method for manufacturing a reflection member, which are suitable for an image forming apparatus having an electrophotographic process, such as a laser beam printer (LBP), a digital copying machine, or a multifunction printer.

Description of the Related Art

There have been proposed various types of scanning optical apparatuses for a laser beam printer (LBP), a digital copying machine, or a multifunction printer, which has an electrophotographic process. Such a scanning optical apparatus converts a light flux, which has been optically modulated and emitted from a light source unit in response to an image signal, into a parallel light flux by a collimator lens and periodically deflects the parallel light flux by an optical deflection unit including a rotating polygon mirror. The deflected light flux is then condensed in a spot shape on a surface of a photosensitive recording medium (photosensitive drum) by a condensing optical system (imaging optical system) having fθ characteristics, and the spot-shaped light flux optically scans the surface to perform image recording.

It has recently been requested, in the case of a laser beam printer, and the like, that high-speed printing be possible, or high-precision printing be obtained. In either case, the number of scanning per unit time needs to be increased. Such a request has been met until now by increasing the number of surfaces of the rotating polygon mirror or by increasing the number of rotations. These methods have a problem in that the rotating polygon mirror becomes larger and rotates at a high speed, that is, the load on the driving motor of the optical deflection unit increases, as well as problems of temperature rise, noise, and increased overall size of the apparatus.

In an attempt to reduce the load on the optical deflection unit, there have been proposed various types of scanning optical apparatuses employing a multi-beam scanning system, which increase the light-emitting points (light-emitting units) of the semiconductor laser as a light source unit and scan the scanned surface using a plurality of light fluxes simultaneously.

It has been generalized, in such a multi-beam scanning system, to provide a synchronous detection optical system and a synchronous detection light-receiving element, as also known in the single-beam scanning system, in order to accurately perform the printing/writing timing of the scanned beam (Japanese Patent Application Laid-open No. H08-179230). In Japanese Patent Application Laid-open No. H08-179230, a synchronous detection mirror is arranged to bend the synchronous detection light flux, and the fθ lens and the light-collecting lens are integrated, so as to reduce the interval between the printing light flux at the outermost angle and the synchronous detection light flux (referred to as gap G in the document).

A synchronous detection mirror employed for such synchronous detection is arranged near the scanning light flux for printing, in an attempt to make the apparatus smaller in the main scanning direction, and therefore has a smaller size (in general, about 10 mm×10 mm) than a mirror configured to reflect the scanning light flux for printing. Conventional methods for manufacturing such a synchronous detection mirror include large-size deposition and post-cutting in longitudinal and transverse directions.

This will be described in detail with reference to FIGS. 5A to 5C. Referring to FIG. 5A, a glass plate 961 (thickness: about 1.8 mm) of about 125 mm×125 mm, for example, is cleaned sufficiently, and a vacuum deposition machine is used to deposit a reflection coating 962 as a metallic coating including aluminum or an aluminum-containing alloy. A protection film 963 having $SiO_2$ or the like as a main component is then deposited on the reflection coating 962. Thereafter, as illustrated in FIG. 5B, known scribe cutting is employed to bend and cut the glass plate 961 into a desired piece size (for example, 10 mm×10 mm) in the longitudinal and transverse directions. The sectional surface (FIG. 5C) obtained by scribe cutting is generally susceptible to burring, so that the cut surface or its angled portion is commonly grinded or light-chamfered.

Another manufacturing method includes pre-cutting in the longitudinal and transverse directions into a piece size and post-deposition, that is, a glass plate is initially cut into a piece size of 10 mm×10 mm, followed by deposition. This method requires a great effort to set the glass plate of a piece size in a vacuum deposition machine, resulting in a high cost. Furthermore, the light piece glass plate can be easily displaced inside the vacuum deposition machine by small impact or vibration, making it difficult to obtain a uniform film. Therefore, synchronous detection mirrors for synchronous detection are generally manufactured according to the above-mentioned method of large-size deposition and post-cutting in longitudinal and transverse directions.

SUMMARY OF THE INVENTION

A scanning optical apparatus according to the present invention includes: a deflection unit configured to deflect a light flux from a light source in a main scanning direction; an incident optical system configured to introduce the light flux from the light source to the deflection unit; a condensing optical system (imaging optical system) configured to condense the light flux from the deflection unit onto a scanned surface; and a reflection member arranged in a light path of the light flux deflected in the main scanning direction by the deflection unit and configured to reflect a part of the deflected light flux. The reflection member has a reflection surface configured to reflect the deflected light flux, a first end surface formed in the main scanning direction, and a second end surface formed in a sub-scanning direction perpendicular to the main scanning direction, and the second end surface has a higher degree of corrosion resistance than the first end surface.

Also, in a scanning optical apparatus including: a deflection unit configured to deflect a light flux from a light source in a main scanning direction; an incident optical system configured to introduce the light flux from the light source to the deflection unit; a condensing optical system configured to condense the light flux from the deflection unit onto a scanned surface; and a reflection member arranged in a light path of the light flux deflected in the main scanning direction by the deflection unit and configured to reflect a part of the deflected light flux, a method for manufacturing a reflection member of the optical scanning apparatus includes: cutting a reflection optical substrate in a first cutting direction corresponding to a direction parallel with a sub-scanning direction perpendicular to the main scanning direction and obtaining a first optical member piece of a rectangular shape elongated in the first cutting direction; forming a reflection coating on a reflection optical surface of the first optical member piece; and cutting the first optical member piece in a second cutting direction corresponding to a direction parallel with the main scanning direction and obtaining a second optical member piece as the reflection member.

Also, in a scanning optical apparatus including: a deflection unit configured to deflect a light flux from a light source in a main scanning direction; an incident optical system (2, 3, 4) configured to introduce the light flux from the light source to the deflection unit; a condensing optical system (6) configured to condense the light flux from the deflection unit onto a scanned surface; and a reflection member (9) arranged in a light path of the light flux deflected in the main scanning direction by the deflection unit and configured to reflect a part of the deflected light flux, a method for manufacturing the optical scanning apparatus includes: cutting a reflection optical substrate in a first cutting direction corresponding to a direction parallel with a sub-scanning direction perpendicular to the main scanning direction and obtaining a first optical member piece (930) of a rectangular shape elongated in the first cutting direction; forming a reflection coating on a reflection optical surface of the first optical member piece (930); cutting the first optical member piece (930) in a second cutting direction corresponding to a direction parallel with the main scanning direction and obtaining a second optical member piece (9') as the reflection member; and embedding the second optical member piece in a housing of the scanning optical apparatus.

Also, in a scanning optical apparatus including: a deflection unit configured to deflect a light flux from a light source in a main scanning direction; an incident optical system configured to introduce the light flux from the light source to the deflection unit; a condensing optical system configured to condense the light flux from the deflection unit onto a scanned surface; and a reflection member arranged in a light path of the light flux deflected in the main scanning direction by the deflection unit and configured to reflect a part of the deflected light flux, another method for manufacturing a reflection member of the scanning optical apparatus according to the present invention includes: forming a reflection coating on a reflection optical surface of a reflection optical substrate; cutting the reflection optical substrate, on which the reflection coating has been formed, in a first cutting direction corresponding to a direction parallel with a sub-scanning direction perpendicular to the main scanning direction and obtaining a first optical member piece of a rectangular shape elongated in the first cutting direction; applying a corrosion inhibitor to an end surface of the first optical member piece cut in the first cutting direction; and cutting the first optical member piece in a second cutting direction corresponding to a direction parallel with the main scanning direction and obtaining a second optical member piece as the reflection member.

Also, in a scanning optical apparatus including: a deflection unit configured to deflect a light flux from a light source in a main scanning direction; an incident optical system (2, 3, 4) configured to introduce the light flux from the light source to the deflection unit; a condensing optical system (6) configured to condense the light flux from the deflection unit onto a scanned surface; and a reflection member (9) arranged in a light path of the light flux deflected in the main scanning direction by the deflection unit and configured to reflect a part of the deflected light flux, another method for manufacturing the optical scanning apparatus includes: forming a reflection coating (942) on a reflection optical surface of a reflection optical substrate (941); cutting the reflection optical substrate (941), on which the reflection coating has been formed, in a first cutting direction corresponding to a direction parallel with a sub-scanning direction perpendicular to the main scanning direction and obtaining a first optical member piece (943) of a rectangular shape elongated in the first cutting direction; applying a corrosion inhibitor to an end surface (944) of the first optical member piece (943) cut in the first cutting direction; cutting the first optical member piece (943) in a second cutting direction corresponding to a direction parallel with the main scanning direction and obtaining a second optical member piece (9') as the reflection member; and embedding the second optical member piece in a housing of the scanning optical apparatus.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 5A:
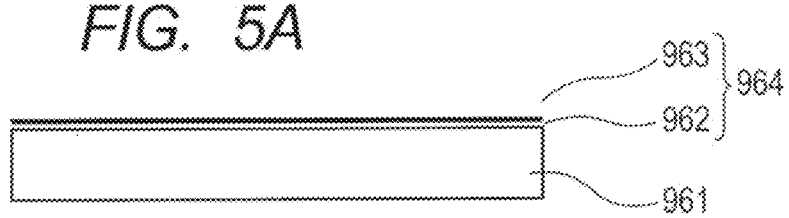
FIG. 5A is a diagram illustrating each process of a conventional method for manufacturing a synchronous detection mirror as a synchronous detection reflection optical unit.
Figure 5B:
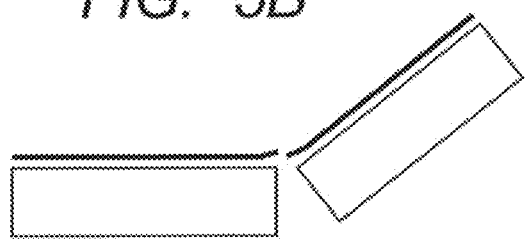
FIG. 5B is a diagram illustrating each process of a conventional method for manufacturing a synchronous detection mirror as a synchronous detection reflection optical unit.
Figure 5C:
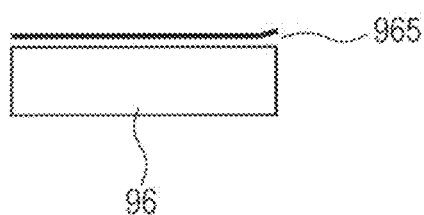
FIG. 5C is a diagram illustrating each process of a conventional method for manufacturing a synchronous detection mirror as a synchronous detection reflection optical unit.

As described above, a conventional reflection member, which is represented by a synchronous detection mirror, has a problem in that a light flux, which is deflected in the main scanning direction, is scattered at an end surface through which the light flux passes (end surface cut in the longitudinal direction). That is, as illustrated in FIGS. 5B and 5C, when the above-mentioned method of large-size deposition and post-cutting in longitudinal and transverse directions is employed, the end portion is curled up, as in the case of end portion 965 of the deposition film, at the time of post-cutting. Even when grinding or light-chamfering is performed to deal with burrs on the cut surface, the end portion of the deposition film is still curled up.

In this case, the end portion 965 of the deposition film, which has been curled up, can easily contact external air, including moisture and $O_2$, and the reflection coating of metallic coating including aluminum or an aluminum-containing alloy undergoes oxidation/corrosion (rusting). Particularly, high temperature/high humidity quickens the corrosion, making it difficult to obtain a desired reflection ratio in the area of the reflection coating of the corroded metallic coating. In addition, the corrosion starting from the cut surface of the end portion of the reflection member gradually proceeds inwards.

As a result, when up to the part close to the cut surface of the reflection member is used to reflect light fluxes, as in the case of Japanese Patent Application Laid-open No. H08-179230, the end portion reflection area of the reflection member is corroded due to the influence of heat or humidity inside the body of the image forming apparatus, degrading the reflection ratio. This results in a problem in that the amount of synchronous detection light reaching the synchronous detection light-receiving element decreases, making sufficient synchronous detection impossible.

The object of the present invention is to provide a scanning optical apparatus and a method for manufacturing a reflection member, which can guarantee both compactness and improved durability of the reflection member and reduce the cost.

Preferred embodiments of the present invention will now be described in detail in accordance with the accompanying drawings.

First Embodiment

Image Forming Apparatus

Figure 4:
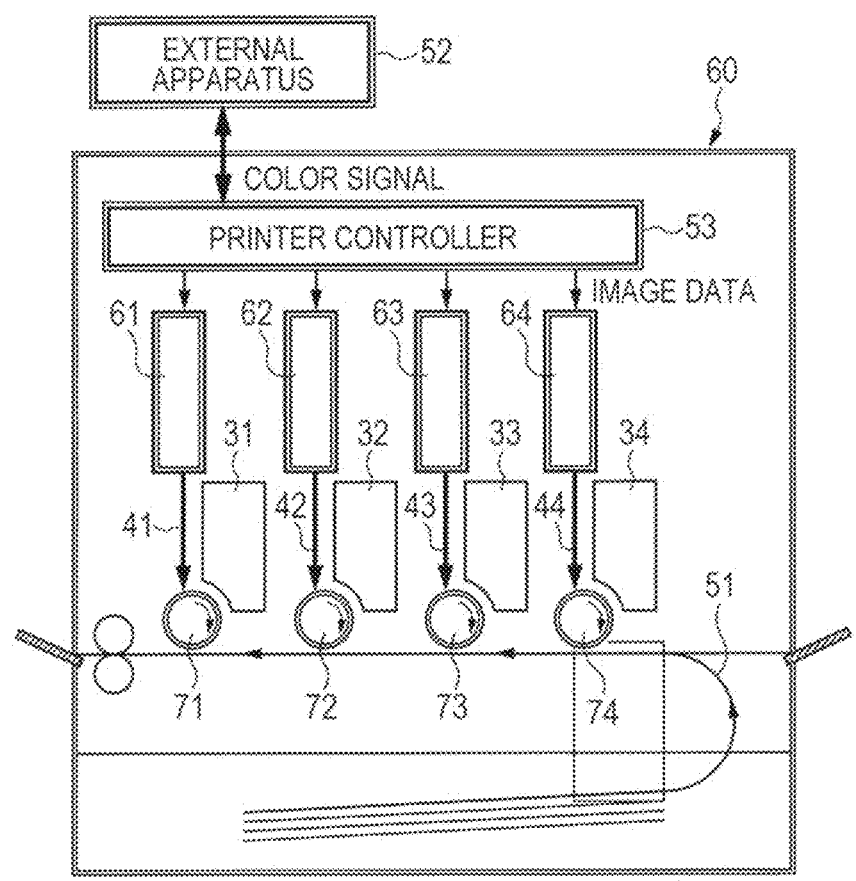
FIG. 4 is a schematic configuration diagram of an image forming apparatus equipped with a scanning optical apparatus according to an embodiment of the present invention.

FIG. 4 is a schematic configuration diagram of an image forming apparatus equipped with a scanning optical apparatus according to an embodiment of the present invention. The image forming apparatus is a tandem-type color image forming apparatus having four optical scanning apparatuses arranged in tandem with one another so that image information is recorded on surfaces of photosensitive drums which are image bearing members. In FIG. 4, reference numeral 60 refers to a color image forming apparatus; reference numerals 61, 62, 63, and 64 refer to optical scanning apparatuses, respectively; reference numerals 71, 72, 73, and 74 refer to photosensitive drums as image bearing members, respectively; reference numerals 31, 32, 33, and 34 refer to developing units, respectively; and reference numeral 51 refers to a conveying belt.

In FIG. 4, the color image forming apparatus further includes a transferring unit (not illustrated) configured to transfer a toner image, which is obtained by developing an electrostatic latent image on the photosensitive drums by the developing unit, to a transferred material and a fixing unit (lower left side of FIG. 4) configured to fix the transferred toner image to the transferred material.

In FIG. 4, respective color signals of R (red), G (green), and B (blue) are input to the color image forming apparatus 60 from an external apparatus 52 such as a personal computer. These color signals have code data converted into each image data (dot data) of C (cyan), M (magenta), Y (yellow), and B (black) by a printer controller 53 inside the apparatus.

The image data is input to respective optical scanning apparatus 61, 62, 63, and 64. Light beams 41, 42, 43, and 44, which have been modulated in response to each image data, are emitted from the optical scanning apparatuses, and the photosensitive surfaces of the photosensitive drums 71, 72, 73, and 74 are scanned in the main scanning direction by the light beams.

The color image forming apparatus according to the present embodiment has four optical scanning apparatuses 61, 62, 63, and 64 arranged in tandem so as to correspond to respective colors of C (cyan), M (magenta), Y (yellow), and B (black). The optical scanning apparatuses 61, 62, 63, and 64 record image signals (image information) on the surfaces of the photosensitive drums 71, 72, 73, and 74 in parallel with one another so that color images can be printed at a high rate.

The color image forming apparatus according to the present embodiment, as described above, has four optical scanning apparatuses 61, 62, 63, and 64 configured to form latent images of respective colors on the surfaces of the corresponding photosensitive drums 71, 72, 73, and 74 using light beams based on each image data. The latent images are then multi-transferred to a recording material to form one sheet of full-color image.

The external apparatus 52 can be a color image reading apparatus equipped with a CCD sensor, for example. In this case, the color image reading apparatus and the color image forming apparatus 60 constitute a color digital copying machine.

Scanning Optical Apparatus

Figure 1A:
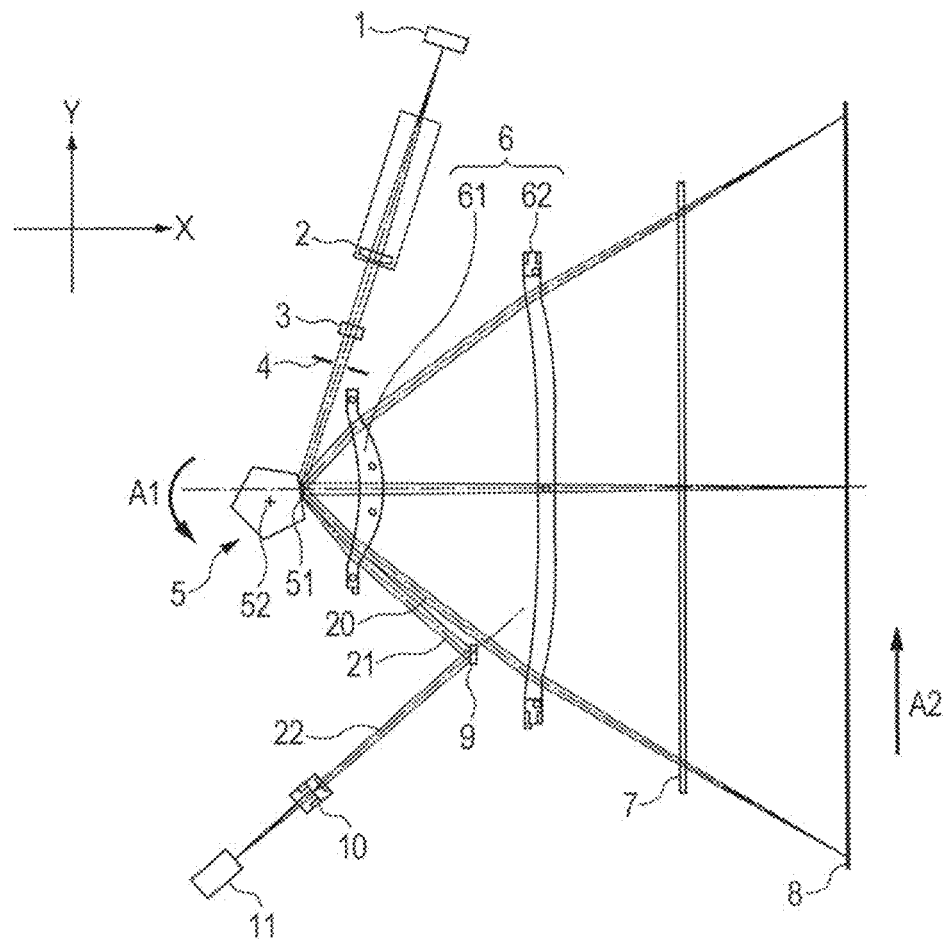
FIG. 1A is a main scanning arrangement diagram of a scanning optical apparatus according to an embodiment of the present invention.

FIG. 1A is a main scanning arrangement diagram of a scanning optical apparatus according to an embodiment of the present invention. In the drawing, reference numeral 1 refers to a laser light source; reference numeral 2 refers to a light-collecting element; reference numeral 3 refers to a cylinder lens; reference numeral 4 refers to a diaphragm; reference numeral 5 refers to a polygon mirror as a deflection unit; reference numeral 6 refers to a condensing lens system including a first condensing lens 61 and a second condensing lens 62; reference numeral 7 refers to a cover glass; and reference numeral 8 refers to a scanned surface (photosensitive body). In addition, the collimator lens 2, the cylinder lens 3, and the diaphragm 4 are referred to as a pre-deflection-unit optical system or an incident optical system.

Furthermore, the first condensing lens 61 and the second condensing lens 62 are condensing lenses made of plastic, and the condensing lens system (condensing optical system, imaging optical system) including these can include one lens or at least three lenses. The condensing lens system is configured to form an image of the light source on the scanned surface (photosensitive body), specifically form a spot-shaped (spot-shaped, small) light-collecting point of light using the light emitted from the laser light source.

As will be described later in detail, reference numeral 9 refers to a synchronous detection reflection mirror (BD mirror) as a reflection member, which is arranged in the light path as a part of the synchronous detection unit; reference numeral 10 refers to a synchronous detection condensing lens (BD lens); and reference numeral 11 refers to a synchronous detection light-receiving element (BD sensor).

In FIG. 1A, a direction parallel with the paper surface is referred to as a main scanning direction (main scanning section), and a direction perpendicular to this is referred to as a sub-scanning direction (sub-scanning section). Directions of the coordinate system are defined as follows: a direction parallel with the optical axis of the condensing lens system 6 is X-axis direction, a direction perpendicular to this while lying on the paper surface is Y-axis direction, and a direction perpendicular to X-axis and Y-axis (perpendicular to the paper surface) is Z-axis direction.

The laser light source 1 is of an end surface light-emitting type or a surface light-emitting type (VCSEL: vertical-cavity surface-emitting laser), and is a multi-beam laser having a plurality of light-emitting portions on a single tip. The wavelength $\lambda$ of emitted light is 650 nm, but the present invention is not limited to this, and infrared light of wavelength $\lambda=850$ nm or blue-ray light of $\lambda=430$ nm can also be used.

The divergent light flux emitted from the laser light source 1 is collected by the light-collecting element and is converted to approximately parallel light. Although a spherical single lens is illustrated as the light-collecting element 2, the present invention is not limited to this, and a bonded lens obtained by bonding glass spherical lenses together, a glass-molded lens, or a plastic-molded lens can also be used. The approximately parallel light emitted by the light-collecting element 2 is converted to a light flux, which converges in the sub-scanning direction, by the cylinder lens 3, and is collected near one reflective deflection surface 51 of the deflection unit 5, thereby forming a line image near the reflective deflection surface 51.

The diaphragm 4 is configured to convert a light flux, which has been emitted from the cylinder lens 3, to a desired light flux width, and has an aperture of an elliptical shape, a rectangular shape, or an oval shape, the shape being determined by the wavelength of the employed light source, the size of the desired beam spot or its shape. The diaphragm 4 can be positioned between the light source 1 and the light-collecting element 2, between the light-collecting element 2 and the cylinder lens 3, or between the cylinder lens 4 and the deflection unit 5.

The diaphragm 4 can be installed as two slit members including one slit member having an edge extending in the sub-scanning direction, for example, to limit the light flux in the main scanning direction and the other slit member having an edge extending in the main scanning direction to limit the light flux in the sub-scanning direction. Particularly, when the laser used as the light source has a large number of light-emitting points, jitter can be reduced by providing a slit member, which limits the light flux in the main scanning direction, near the deflection unit.

Similarly, when the laser used as the light source has a large number of light-emitting points, uniformity of the printing interval of a plurality of beams can be improved by providing a slit member, which limits the light flux in the sub-scanning direction, in a conjugated position (approximately between the light source 1 and the light-collecting element 2) with the scanning lens. Considering such a technological aspect, a diaphragm split into a plurality of members can be employed.

The deflection unit 5, which includes a plurality of reflective deflection surfaces, is driven rotationally about the rotation axis 52 in the direction of arrow A1 in FIG. 1A by a driving system (not illustrated). As a result, a scanning light flux is scanned on the scanned surface 8 in the direction of arrow A2.

The main light ray of the incident light flux introduced into the deflection unit 5 by the incident optical system is incident in a direction perpendicular to the reflective deflection surface 51 within the sub-scanning section. The deflection unit 5 then deflects the light flux by means of a reflective deflection surface 51, which is driven rotationally, and introduces the light flux to the condensing lens system 6 (an fθ lens, a scanning lens, and also referred to as a scanning optical system).

Next, operations of the condensing lens system 6 will be described. The condensing lens system 6 includes two lenses including a first condensing lens 61 made of plastic and a second condensing lens 62 made of plastic. The condensing lens system 6 condenses a light flux, which has been deflected by the deflection unit 5, on the scanned surface 8 to form a beam spot, and scans the scanned surface 8 at a constant speed. The first and second condensing lenses 61 and 62, which are made of plastic, are manufactured by known molding technology: a mold is filled with a resin, which is cooled and removed from the mold, lowering the manufacturing cost compared with conventional scanning lenses made of glass lenses.

The condensing lens system 6 is designed by known power arrangement. For example, the first condensing lens 61 is configured as an aspheric lens having power mainly in the main scanning direction, and the lens surface shape is an aspheric surface expressed by a known function. The first condensing lens 61 is a convex meniscus, the power of which in the main scanning section is larger than its power in the sub-scanning section, the main scanning section of which is not an arc, and which has a concave surface facing the deflection unit 5. In addition, the shape within the main scanning section is symmetric with respect to the optical axis. With respect to the sub-scanning direction, approximately non-power, that is, the incident surface and the emission surface having the same curvature, can be adopted, or power can be assigned according to specifications.

The second condensing lens 62 is an anamorphic lens having power mainly in the sub-scanning direction, and the lens surface shape is an aspheric shape expressed by a known function. That is, the second condensing lens 62 is shaped so that its power within the sub-scanning section is larger than the power within the main scanning direction, the incident surface of the main scanning section is an arc, and the other surface is not an arc. The shape within the main scanning section is symmetric with respect to the optical axis, and the main scanning direction near the axis is approximately non-power.

The shape of the sub-scanning section is as follows: the curvature of the incident surface is extremely gentle, that is, approximately planar, and the curvature of the emission surface gradually changes from the axis to the outside of the axis, resulting in a convex shape which is symmetric with respect to the optical axis. The second condensing lens 62 is, with respect to the incident light flux, in charge of condensing mainly in the sub-scanning direction and correction of minor distortion in the main scanning direction. The condensing relationship in the sub-scanning direction by the condensing lens system 6 constitutes a so-called tilt correcting system, where the reflective deflection surface 51 and the scanned surface 8 are in a conjugated relationship.

The cover glass 7 is inclined to have an angle with respect to the incident light flux within the sub-scanning section. This is for the purpose of preventing light, which is reflected at the surface of the cover glass 7, from returning to the laser light source 1. If light reflected at the surface returns to the laser light source 1, laser oscillation becomes unstable, varying the quantity of light.

In addition, the condensing lens system 6 is not necessarily configured as described above, and the function expression formula can also be a known expression formula. It can also be asymmetric with respect to the optical axis, in order to improve condensing performance.

Synchronous Detection System

A synchronous detection reflection mirror (BD mirror) 9, which is a synchronous detection reflection optical unit, and synchronous detection condensing lens (BD lens) 10 are provided as a synchronous detection optical system, and, together with a synchronous detection light-receiving element (BD sensor) 11, constitute a synchronous detection system. With respect to a light flux of an image height outside the effective image area on the scanned surface 8, the light path is divided by the BD mirror 9, and synchronous detection light is introduced into the BD sensor 11 by the BD lens 10, so that timing of printing/writing is detected. As illustrated in FIG. 1A, a synchronous detection light flux directed to the sensor surface passes through the condensing lens 61, which constitutes a part of the condensing optical system 6.

Figure 1B:
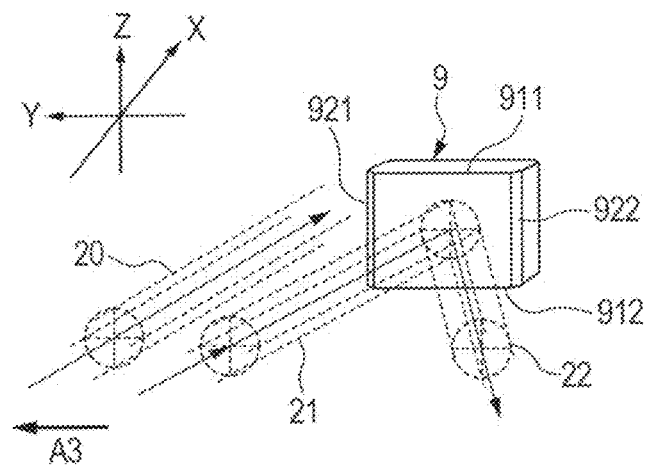
FIG. 1B is a perspective view illustrating major parts of a synchronous detection reflection optical unit according to an embodiment of the present invention.

In FIGS. 1A and 1B, a most off-axis light flux 20 of the effective image area and a synchronous detection light flux 21 are illustrated. The most off-axis light flux 20 and the synchronous detection light flux 21 are beams that scan in the direction of arrow A3 in FIG. 1B by rotation of the deflection unit 5. The most off-axis light flux 20 and the synchronous detection light flux 21 are light paths at close timing, and the BD mirror 9 separates a light flux directed to the BD sensor 11, which is a synchronous sensor, from a light flux directed to the scanned surface.

The BD lens 10 at least has power in the main scanning direction, and is configured to condense a synchronous detection light flux 22, which is yet to pass through the BD lens 10, in the main scanning direction. The BD sensor 11 has a light-receiving portion arranged near the main scanning direction condensing point of the synchronous detection light flux, and the light-receiving portion has an edge parallel with the sub-scanning direction. Alternatively, a BD edge member having an edge parallel with the sub-scanning direction, which is provided towards the deflection unit 5 from the light-receiving portion, is arranged near the main scanning direction condensing point of the synchronous detection light flux.

Methods for synchronous detection of a plurality of beams (multi-beam) include a method of synchronously detecting all of the plurality of beams and determining the write timing. According to another method known in the art, a specific beam is solely detected synchronously, and the write timing of the other beams is determined by adding a predetermined delay time to the synchronously detected beam.

The most off-axis light flux 20 and the synchronous detection light flux 21 are positioned as close as possible. This is because separation between the most off-axis light flux 20 and the synchronous detection light flux 21 requires increase of the effective area of the condensing lens 61 and increase of the reflective deflection surface 51 of the deflection unit 5, making the apparatus larger.

BD Mirror

Next, the configuration of the BD mirror 9 as a synchronous detection reflection optical unit will be described with reference to FIG. 1B. In connection with the BD mirror 9, as the distance between mirror end portion 921 and the effective reflection area is shorter, the apparatus is more effectively prevented from being larger. As described above, however, it is desired to solve the problem of corrosion of the end portion reflection area of the BD mirror 9 due to the influence of temperature rise or humidity inside the image forming apparatus. This will be described later in connection with a method for manufacturing the BD mirror.

In FIG. 1B, the BD mirror 9 has first end surfaces 911 and 912 parallel with the main scanning direction (arrow A3) and second end surfaces 921 and 922 parallel with a direction (sub-scanning direction) perpendicular to the scanning direction (arrow A3). The first and second end surfaces are respectively two surfaces facing each other. The first end surfaces are preferably parallel with the main scanning direction, but are not necessarily parallel with the main scanning direction (they can be arranged along the main scanning direction to have an angle of about 0 to 10 degrees with respect to the main scanning direction).

Similarly, the second end surfaces are preferably parallel with the sub-scanning direction, but are not necessarily parallel with the sub-scanning direction (they can be arranged along the sub-scanning direction to have an angle of about 0 to 10 degrees with respect to the sub-scanning direction).

The first and second end surfaces are preferably perpendicular to the reflection surface, and the first end surfaces have an area larger than that of the second end surfaces. Such a relative area determination is made based on the following consideration: the BD mirror (reflection member), which has the reflection surface, the first end surfaces, and the second end surfaces, is preferably a cuboid as a stereoscopic shape, but is not necessarily a cuboid. That is, at least one of the reflection surface, the first end surfaces, and the second end surfaces can have a surface shape deformed slightly from a rectangle, such as a parallelogram or a trapezoid. In such a case of deformation from the cuboid, the above-mentioned relative area determination can be made assuming that a cuboid has not deformed.

Specifically, when the reflection surface has a shape deformed from a rectangle, the above-mentioned relative area determination can be made assuming that the reflection surface has a rectangular shape surrounded by a pair of straight lines inscribed in the shape of the reflection surface and parallel with the main scanning direction and another pair of straight lines parallel with the sub-scanning direction.

The specific size of the BD mirror 9 is as follows: the first end surface 911 has a length of L1=11 mm, and the second end surface 921 has a length of L2=10 mm, forming a rectangular shape. Since the first end surfaces have an area larger than that of the second end surfaces as described above, the first end surface 911 parallel with arrow A3 and the second end surface 921 parallel with a direction perpendicular to arrow A3 have end edges of different lengths. This makes it possible to recognize the direction.

Method for Manufacturing the BD Mirror

Figure 2A:
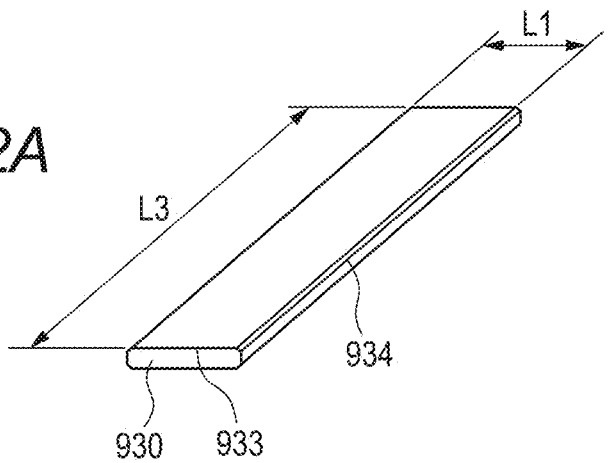
FIG. 2A is a diagram illustrating each process of a method for manufacturing a synchronous detection mirror as a synchronous detection reflection optical unit according to a first embodiment.
Figure 2B:
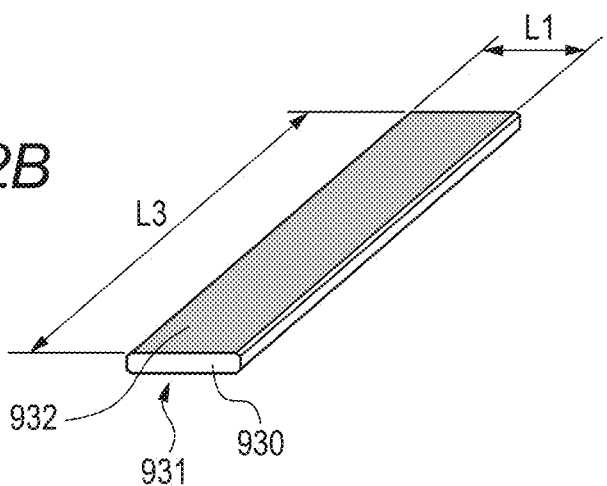
FIG. 2B is a diagram illustrating each process of a method for manufacturing a synchronous detection mirror as a synchronous detection reflection optical unit according to a first embodiment.
Figure 2C:
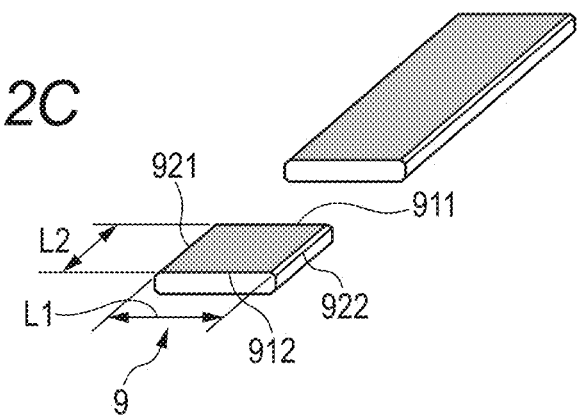
FIG. 2C is a diagram illustrating each process of a method for manufacturing a synchronous detection mirror as a synchronous detection reflection optical unit according to a first embodiment.

Next, a first method for manufacturing the BD mirror 9 will be described with reference to FIGS. 2A to 2C. A process of preparing a pre-deposition glass preform will be described with reference to FIG. 2A. A float glass plate 930 (first optical member piece), which is a reflection optical substrate as a preform of the BD mirror 9, has the following size: its transverse end surface 933 has a length L1 of 11 mm, and the longitudinal end surface 934 has a length L3 of L3=L2×N+α. Taking any lengths as long as N is an integer and α is α<L2, the amount of discarded material can be reduced.

The float glass plate 930 is obtained by cutting large-size blank glass into an elongated size of L3 mm in the longitudinal direction, which corresponds to the first cutting direction, and L1 mm in the transverse direction, which corresponds to the second cutting direction (first process). The cutting is known scribe cutting. That is, the front or rear surface is scratched by a diamond blade along a line to be cut, and bending stress is applied to left and right sides of the line to be cut, so that the glass plate, to which stress is applied, is split along the line scratched by the diamond blade and then divided.

The scribe-cut section is generally susceptible to burring, so that the cut surface or its angled portion can be grinded or light-chamfered. Particularly, the longitudinal end surface 934 is preferably light-chamfered to prevent any work-related injury.

Next, a process of forming a reflection coating on a surface of the float glass plate 930, which becomes a reflection optical surface, (second process) will be described with reference to FIG. 2B. FIG. 2B illustrates an elongated mirror 931 obtained by forming a multilayered film 932 on the float glass plate 930 of an elongated size (the longitudinal direction is brought into coincidence with a direction perpendicular to the main scanning direction). The surface of the float glass plate 930 as a preform is cleaned and dried sufficiently, and a vacuum deposition machine is used to form a group of films of at least two types, including a metal reflection thin film and an overlying protection thin film, as a reflection coating.

The metal reflection thin film is formed using a metal-based material, specifically an aluminum-based material or a chromium-based material, when the cost is considered important, or a copper-based material when excellent reflection/no polarization characteristics are considered important.

The protection thin film is formed as a single-layered or multilayered film using a Ti-based material or a SI-based material for the purpose of improving resistance to moisture, resistance to wear, resistance to chemicals, resistance to oxidation, and the like. It is also possible to form an undercoat layer for the purpose of improving adhesion between the metal reflection thin film and the glass preform. Such a reflection coating can be formed, instead of the above-mentioned vacuum deposition, by a coating technique such as sputtering.

Setting the float glass plate 930 of an elongated size in a vacuum deposition machine requires less effort than when a small-piece glass plate of L1×L2 is set, thereby reducing the cost. Furthermore, the float glass plate 930 is heavier than the small-piece glass plate of L1×L2 and is less likely to be displaced by impact or vibration than the small-piece glass plate of L1×L2, making it possible to stably form a uniform film inside the vacuum deposition machine.

Next, a cutting process to obtain a BD mirror (small-piece mirror) as a second optical member piece (third process) will be described with reference to FIG. 2C. As in the case of the float glass plate 930, scribe cutting is performed to obtain L2=10 mm, but light-chamfering can be performed after the cutting. A BD mirror 9 is obtained as a result.

The present manufacturing method has a difference in that the first end surfaces 911 and 912 are cut after deposition, but the second end surfaces 921 and 922 are cut before deposition. That is, the first end surfaces 911 and 912 are surfaces left unchanged since cutting after formation of a reflection coating on the reflection surface, and the second end surfaces 921 and 922 are surfaces left unchanged since cutting before formation of the reflection coating.

The first end surfaces 911 and 912, which have been cut after deposition, (surfaces cut in the transverse direction which is parallel with the main scanning direction) are curled up just like the end portion 965 of the deposition film at the time of post-cutting as illustrated in FIG. 5B. The end portion 965 of the deposition film, which has been curled up, can easily contact external air, including moisture and $O_2$, and the reflection coating of metallic coating including aluminum or an aluminum-containing alloy undergoes oxidation/corrosion.

As a result of an experiment of leaving the first end surfaces 911 and 912 in an atmosphere of constant temperature and high humidity, for example, temperature of 70° C. and humidity of 90%, for twenty days, corrosion has proceeded about 0.8 to 1.2 mm from the mirror end surface. It has been confirmed that the corroded part has a greatly reduced reflection ratio, meaning that the reflection performance falls as a result of constant-temperature high-humidity endurance. Therefore, an effective area of a direction (sub-scanning direction) perpendicular to the main scanning direction can be set on the inside at a distance of at least 1.2 mm from the mirror end portion.

In this case, the positional relationship of the most off-axis light flux 20 and the synchronous detection light flux 21 in the main scanning direction is not affected even if the distance between the first end surfaces 911 and 912, which face each other in a direction (longitudinal direction) perpendicular to the main scanning direction, increases a number of millimeters. That is, there is no need to enlarge the condensing lens 61 or the deflection surface 51 of the deflection unit 5 in the main scanning direction, and the apparatus size does not increase either.

In contrast, in the case of the second end surfaces 921 and 922 which have been cut before deposition, the deposition film remains firmly attached to the glass plate. Therefore, there is no end portion 965 of the deposition film, which has been curled up, as illustrated in FIG. 5C. As a result, the reflection coating of the metallic coating hardly undergoes oxidation/corrosion and, when left in an atmosphere of constant temperature and high humidity, for example, temperature of 70° C. and humidity of 90%, for twenty days, no corrosion has been observed, and the same reflection ratio characteristics as in the initial period have been obtained.

As a result, the second end surfaces 921 and 922, through which a light flux deflected in the main scanning direction passes, require no consideration of degradation of the reflection coating due to corrosion, making it possible to set a small effective area from the mirror end surface. Specifically, light-chamfering provided on the longitudinal end surface 934 of the float glass plate 930 is generally about C0.2 to 0.5, so that the distance between the mirror end surface and the effective area can be set to be about 0.6 mm.

As described above, the second end surfaces 921 and 922, which have been cut before deposition, hardly undergo corrosion (resistance to corrosion is excellent) compared with the first end surfaces 911 and 912. This makes it possible to reduce the distance between the mirror end surface and the effective area, in connection with the second end surfaces 921 and 922, and to position the most off-axis light flux 20 and the synchronous detection light flux 21 close to each other, thereby making the apparatus compact.

Furthermore, by employing a process of cutting the first end surfaces 911 and 912 after deposition, deposition can be performed with respect to the float glass plate 930 of an elongated size, which reduces the effort to set the substrate in the vacuum deposition machine, and which decreases the cost. Compared with a small-piece glass plate of L1×L2, the float glass plate 930 is hardly displaced by impact or vibration, making it possible to stably form a uniform film inside the vacuum deposition machine.

The BD mirror 9 has the following size: mirror end portion 911 has a length L1=11 mm, and mirror end portion 912 has a length L2=10 mm, so that it has a rectangular shape, with the end surfaces having different lengths. Such different lengths make it possible to easily recognize end surfaces that are resistant to corrosion. In addition, although a rectangular shape of L1=11 mm, L2=10 mm has been described in connection with the present embodiment, the present invention is not limited to this, and L1<L2 is also possible. Furthermore, a mounting standard can be provided so that the mounting portions of the BD mirror correspond to L1 and L2, thereby preventing erroneous mounting.

Second Embodiment

Next, a second embodiment will be described with reference to FIGS. 3A to 3D. As in the case of the first embodiment, the BD mirror 9 has first end surfaces 911 and 912 parallel with the main scanning direction (arrow A3) and second end surfaces 921 and 922 parallel with a direction perpendicular to the main scanning direction (arrow A3). The size of the BD mirror 9 is as follows: the mirror end portion 911 has a length of L1=11 mm, and the mirror end portion 921 has a length of L2=10 mm, forming a rectangular shape with end surfaces of different lengths.

Method for Manufacturing BD Mirror

Figure 3A:
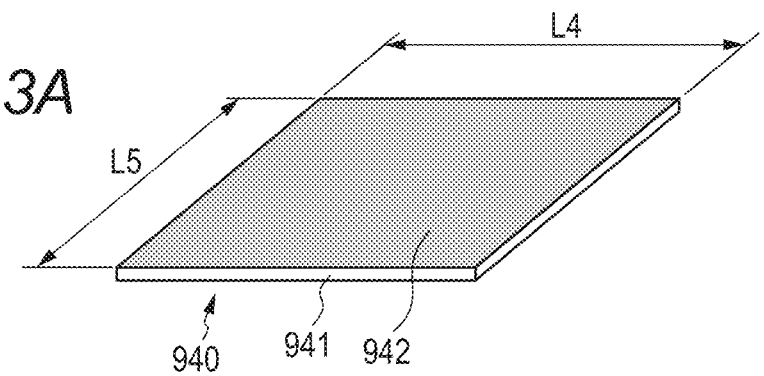
FIG. 3A is a diagram illustrating each process of a method for manufacturing a synchronous detection mirror as a synchronous detection reflection optical unit according to a second embodiment.

Next, a second method for manufacturing the BD mirror 9 will be described with reference to FIGS. 3A to 3D. FIG. 3A illustrates a medium-sized mirror before cutting. A float glass plate 941, which is a glass preform before deposition, has the following size: its length in the main scanning direction (transverse direction) is L4=L1×M+β, and the length in a direction (longitudinal direction) perpendicular to the main scanning direction is L5=L2×N+α. Taking any lengths as long as M and N are integers, α<L2, and β<L1, the amount of discarded material can be reduced.

The float glass plate 941 is obtained by cutting large-sized plate glass into a desired medium size of L4 mm×L5 mm. The cutting is known scribe cutting. That is, the front or rear surface is scratched by a diamond blade along a line to be cut, and bending stress is applied to left and right sides of the line to be cut. The glass plate, to which stress is applied, is split along the line scratched by the diamond blade and then divided. The scribe-cut section is generally susceptible to burring, so that the cut surface or its angled portion can be grinded or light-chamfered.

Next, a process of forming a reflection coating (first process) will be described with reference to FIG. 3A. With respect to the float glass plate 941 as a preform, a surface, which becomes a reflection optical surface, is cleaned and dried sufficiently, and a vacuum deposition machine is used to form a group of films of at least two types, including a metal reflection thin film and an overlying protection thin film, as a reflection coating. The metal reflection thin film is formed using a metal-based material, specifically an aluminum-based material or a chromium-based material, when the cost is considered important, or a copper-based material when excellent reflection/no polarization characteristics are considered important. The protection thin film is formed as a single-layered or multilayered film using a Ti-based material or a SI-based material for the purpose of improving resistance to moisture, resistance to wear, resistance to chemicals, resistance to oxidation, and the like.

It is also possible to form an undercoat layer for the purpose of improving adhesion between the metal reflection thin film and the glass preform. Such a coating can be formed, instead of vacuum deposition, by a coating technique such as sputtering. In this manner, a medium-sized mirror 940 is manufactured by coating the float glass plate 941, which is a reflection optical substrate, with a reflection coating 942.

Figure 3B:
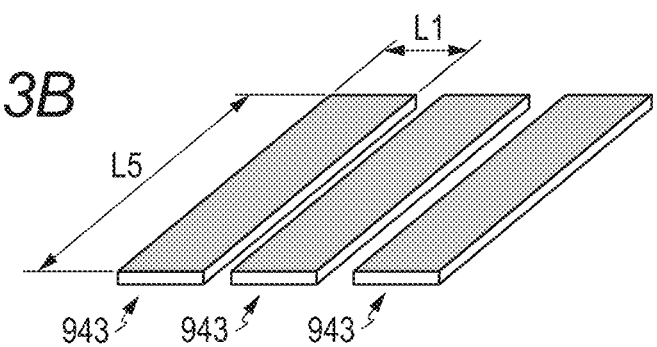
FIG. 3B is a diagram illustrating each process of a method for manufacturing a synchronous detection mirror as a synchronous detection reflection optical unit according to a second embodiment.

Next, as illustrated in FIG. 3B, the medium-sized mirror 940 is cut into a mirror 943 of an elongated size (second process). The above-mentioned scribe cutting is employed to obtain a dimension of L1 mm (transverse direction)×L5 mm (longitudinal direction). After the cutting, light-chamfering is preferably performed to prevent any work-related injury.

The cut surface after formation of the reflection coating is curled up just like the end portion 965 of the deposition film as illustrated in FIG. 5C. The end portion 965 of the deposition film, which has been curled up, can easily contact external air, including moisture and $O_2$, and the reflection coating of metallic coating including aluminum or an aluminum-containing alloy undergoes oxidation/corrosion. Particularly, corrosion proceeds rapidly in an atmosphere of high temperature and high humidity. Therefore, corrosion of the cut surface is prevented in the following process.

Figure 3C:
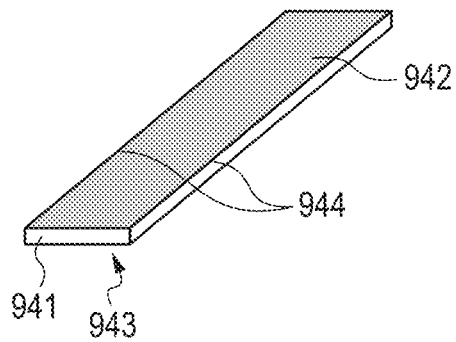
FIG. 3C is a diagram illustrating each process of a method for manufacturing a synchronous detection mirror as a synchronous detection reflection optical unit according to a second embodiment.

A process of applying a corrosion inhibitor (third process) will be described with reference to FIG. 3C. A corrosion inhibitor 944 is applied to a longitudinal end surface along a longitudinal end portion chamfered portion of the mirror 943 of an elongated size, which is a first optical member piece cut from the medium-sized mirror 940. As the corrosion inhibitor, trademark "MIRRORTECT" (NGS INTERIA CO., LTD.) is used, for example. Since application can be performed in a breath in an elongated state having a dimension of L1 mm×L5 mm, the number of processes can be smaller than when application is performed with respect to a smaller dimension of L1 mm×L2 mm.

Figure 3D:
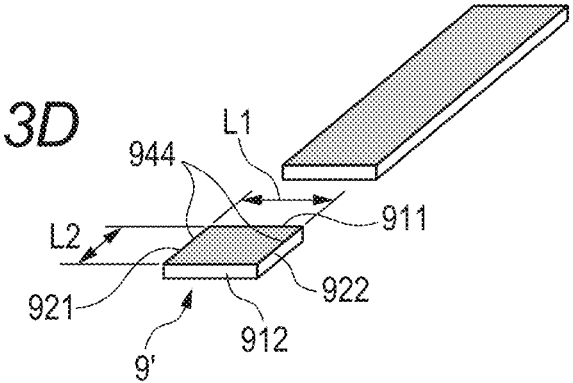
FIG. 3D is a diagram illustrating each process of a method for manufacturing a synchronous detection mirror as a synchronous detection reflection optical unit according to a second embodiment.

Next, a cutting process to obtain a small-piece BD mirror 9' as a second optical member piece (fourth process) will be described with reference to FIG. 3D. Scribe cutting is performed to obtain L2=10 mm. Light-chamfering can be performed after the cutting, and a BD mirror 9' is obtained in this manner.

In connection with the BD mirror 9', there is a difference in that the first end surfaces 911 and 912 are left unchanged since cutting, while a corrosion inhibitor 944 has been applied to the second end surfaces 921 and 922 after cutting. The first end surfaces 911 and 912 are curled up just like the end portion 965 of the deposition film at the time of post-cutting, as illustrated in FIG. 5C. The end portion 965 of the deposition film, which has been curled up, can easily contact external air, including moisture and $O_2$, and the reflection coating of metallic coating including aluminum or an aluminum-containing alloy undergoes oxidation/corrosion.

Particularly, corrosion proceeds rapidly in an atmosphere of high temperature and high humidity, and, as a result of an experiment of leaving the first end surfaces 911 and 912 in an atmosphere of constant temperature and high humidity, for example, temperature of 70° C. and humidity of 90%, for twenty days, corrosion has proceeded about 0.8 to 1.2 mm from the mirror end surface. It has been confirmed that the corroded part has a greatly reduced reflection ratio, meaning that the reflection performance falls as a result of constant-temperature high-humidity endurance. Therefore, an effective area can be set on the inside at a distance of at least 1.2 mm from the mirror end portion. However, the positional relationship of the most off-axis light flux 20 and the synchronous detection light flux 21 is not affected even if the distance between the first end surfaces 911 and 912 increases a number of millimeters, there is no need to enlarge the condensing lens 61 or the deflection surface 51 of the deflection unit 5, and the apparatus size does not increase either.

In contrast, in the case of the second end surfaces 921 and 922 to which a corrosion inhibitor 944 has been applied, the reflection coating of metallic coating hardly undergoes oxidation/corrosion, due to application of the corrosion inhibitor. When left in an atmosphere of constant temperature and high humidity, for example, temperature of 70° C. and humidity of 90%, for twenty days, no corrosion has been observed, and the same reflection ratio characteristics as in the initial period have been obtained. As a result, the second end surfaces 921 and 922 require no consideration of degradation of the reflection coating due to corrosion, making it possible to set a small effective area from the mirror end surface. Specifically, light-chamfering provided on the longitudinal end surface 934 of the float glass plate 930 is generally about C0.2 to 0.5. Thus, the distance between the mirror end surface and the effective area can be set to be about 0.6 to 0.7 mm.

As described above, the second end surfaces 921 and 922, which have been cut before deposition, hardly undergo corrosion (resistance to corrosion is excellent) compared with the first end surfaces 911 and 912. This makes it possible to reduce the distance between the mirror end surface and the effective area, in connection with the second end surfaces 921 and 922, and to position the most off-axis light flux 20 and the synchronous detection light flux 21 close to each other, thereby making the apparatus compact in the main scanning direction.

Furthermore, by employing a process of cutting the medium-sized mirror 940 into a size of L1×L5 after deposition, the effort to set the substrate in the vacuum deposition machine can be saved, and the cost can be reduced. Compared with a small-piece glass plate of L1×L2, the medium-sized mirror 940 is hardly displaced by impact or vibration, making it possible to stably form a uniform film inside the vacuum deposition machine. In addition, although a rectangular shape of L1=11 mm, L2=10 mm has been described in connection with the present embodiment, the present invention is not limited to this.

Modification 1

Although it has been assumed in the above description of an embodiment that the light source has a plurality light-emitting portions so that a plurality of light fluxes (multi-beam) passes through a synchronous detection reflection optical unit, the light source can also have a single light-emitting portion so that a single light flux (single beam) passes through the synchronous detection reflection optical unit.

Modification 2

In addition, although a synchronous detection mirror has been illustrated as a synchronous detection reflection optical unit, the mirror can be replaced with a prism, for example.

Modification 3

The above-described embodiment has adopted a so-called monolithic multi-beam scheme, where a plurality of light-emitting points is provided on a single semiconductor substrate, as a light source type used in a multi-beam scanning system. According to this scheme, no beam composition unit is necessary if the semiconductor laser element can also be manufactured, so that use of such a light source element makes the scanning optical apparatus simple and easily makes the entire apparatus compact. However, it is also possible to arrange a plurality of semiconductor laser elements, which emit laser light (light flux), in tandem, as another light source type, and to obtain a plurality of light fluxes using a light path composition unit of a polarization beam splitter or a half mirror.

In addition, semiconductor laser elements employing a monolithic multi-beam scheme are largely classified into two groups. The first group includes horizontal resonator-type semiconductor lasers, and the second group includes vertical resonator-type semiconductor lasers. Such semiconductor laser elements are classified according to whether the direction of the resonator (light beam emission direction) is parallel or vertical with respect to the configuration of elements stacked on the wafer substrate surface, although either group of them are manufactured by a semiconductor process.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-270305, filed on Dec. 11, 2012, which is hereby incorporated by reference herein in its entirety.

What is claimed is:

1. A method for manufacturing a scanning optical apparatus including a deflection unit configured to deflect a light flux and scan a scanned surface in a main scanning direction, a condensing optical system configured to guide the light flux from the deflection unit to the scanned surface, and a reflection member configured to reflect the light flux from the deflection unit which is not incident on an effective image area of the scanned surface, and a light-receiving element configured to receive the light flux from the reflection member, the method comprising:

cutting an optical substrate in a first direction to form a first optical member;

providing the first optical member with a light-chamfered portion which is parallel to the first direction;

applying a reflection coating to the first optical member to form a reflection surface;

cutting the first optical member on which the reflection coating is applied in a second direction to obtain the reflection member, the second direction being perpendicular to the first direction; and arranging the reflection member such that the light flux from the deflection unit passes through the light-chamfered portion and a first end surface of the reflection member, the first end surface being parallel to the first direction and a sub-scanning direction, wherein the sub-scanning direction is perpendicular to the main scanning direction, wherein the first end surface has a higher degree of corrosion resistance than a second end surface of the reflection member, the second end surface being parallel to the second direction and the main scanning direction,
wherein the light-chamfered portion is provided between the reflection surface and the first end surface, and
wherein the reflection coating is applied to the light-chamfered portion.

2. The method according to claim 1, wherein the reflection coating is not applied to the second end surface, whereas the reflection coating is applied to the first end surface.

3. The method according to claim 1, wherein the first optical member is cut such that a length of the reflection surface in the second direction is greater than a length of the reflection surface in the first direction.

4. The method according to claim 1, wherein the first optical member is cut such that the following conditional expressions are satisfied, $$L3=L2 \times N+\alpha$$

$$\alpha<L2$$

where L2 (mm) is a length of the reflection surface in the first direction, L3 (mm) is a length of the first optical member in the first direction, N is the number of the reflection members obtained from the first optical member, and a (mm) is a length of a discarded material obtained from the first optical member in the first direction.

5. The method according to claim 1, wherein the first optical member is cut by scratching the first optical member on which the reflection coating is formed in the first direction and applying bending stress to left and right sides of the scratch.

6. The method according to claim 1,
wherein a light-chamfered portion is not provided between the reflection surface and the second end surface.

7. The method according to claim 1, wherein the applying the reflection coating includes forming the reflection surface by vacuum deposition or sputtering.

8. The method according to claim 1, wherein the reflection coating is not applied to the second end surface, whereas a corrosion inhibitor is applied to the first end surface.

9. A method for manufacturing a scanning optical apparatus including a deflection unit configured to deflect a light flux and scan a scanned surface in a main scanning direction, a condensing optical system configured to guide the light flux from the deflection unit to the scanned surface, a reflection member configured to reflect the light flux from the deflection unit which is not incident on an effective image area of the scanned surface, and a light-receiving element configured to receive the light flux from the reflection member, the method comprising:
applying a reflection coating to an optical substrate to form a reflection surface;
cutting the optical substrate on which the reflection coating is applied in a first direction to form a first optical member;
providing the first optical member with a light-chamfered portion which is parallel to the first direction;
applying a corrosion inhibitor to the light-chamfered portion and a first end surface of the first optical member, the first end surface being parallel to the first direction;
cutting the first optical member in a second direction to obtain the reflection member, the second direction being perpendicular to the first direction; and
arranging the reflection member such that the light flux from the deflection unit passes through the light-chamfered portion and the first end surface, the first end surface being parallel to a sub-scanning direction,
wherein the sub-scanning direction is perpendicular to the main scanning direction,
wherein the first end surface has a higher degree of corrosion resistance than a second end surface of the reflection member, the second end surface being parallel to the second direction and the main scanning direction,
wherein the light-chamfered portion is provided between the reflection surface and the first end surface.

10. The method according to claim 9, wherein neither the reflection coating nor the corrosion inhibitor is applied to the second end surface.

11. The method according to claim 9, wherein the first optical member is cut such that a length of the reflection surface in the second direction is greater than a length of the reflection surface in the first direction.

12. The method according to claim 9, wherein the first optical member is cut such that the following conditional expressions are satisfied, $$L3=L2 \times N+\alpha$$

$$\alpha<L2$$

where L2 (mm) is a length of the reflection surface in the first direction, L3 (mm) is a length of the first optical member in the first direction, N is the number of the reflection members obtained from the first optical member, and α (mm) is a length of a discarded material obtained from the first optical member in the first direction.

13. The method according to claim 9, wherein the first optical member is cut by scratching the first optical member in the second direction and applying bending stress to left and right sides of the scratch.

14. The method according to claim 9, wherein a light-chamfered portion is not provided between the reflection surface and the second end surface.

15. The method according to claim 9, wherein the applying the reflection coating includes forming the reflection surface by vacuum deposition or sputtering.

* * * * *